United States Patent [19]

Patel et al.

[11] Patent Number: 5,781,497

[45] Date of Patent: Jul. 14, 1998

[54] RANDOM ACCESS MEMORY WORD LINE SELECT CIRCUIT HAVING RAPID DYNAMIC DESELECT

[75] Inventors: Vipul Patel, San Jose; Chitranjan N. Reddy, Los Altos Hills, both of Calif.

[73] Assignee: Alliance Semiconductor Corp., San Jose, Calif.

[21] Appl. No.: 695,064

[22] Filed: Aug. 2, 1996

[51] Int. Cl.[6] .................................................. G11C 8/00
[52] U.S. Cl. .................. 365/230.06; 365/189.11; 365/203
[58] Field of Search .................. 365/230.06, 203, 365/189.11; 326/108, 121

[56] References Cited

U.S. PATENT DOCUMENTS

| | | | |
|---|---|---|---|
| 4,649,521 | 3/1987 | Tsuchida et al. | 365/185 |
| 4,788,664 | 11/1988 | Tobita | 365/189 |
| 4,951,259 | 8/1990 | Sato et al. | 365/230.06 |
| 4,954,731 | 9/1990 | Dhong et al. | 307/482 |
| 5,282,171 | 1/1994 | Tokami et al. | 365/230.01 |
| 5,363,338 | 11/1994 | Oh | 365/230.06 |
| 5,412,331 | 5/1995 | Jun et al. | 326/105 |
| 5,490,119 | 2/1996 | Sakurai et al. | 365/230.06 |
| 5,602,796 | 2/1997 | Sugio | 365/230.06 |

Primary Examiner—Son T. Dinh
Attorney, Agent, or Firm—Bradley T. Sako

[57] ABSTRACT

A word line select circuit (10) having a rapid de-select operation is disclosed. A group of word lines (12a–12d) is selected in response to a row address and the initial edge of a timing signal (i/RAS) by pulling a group select node (24) to a low power supply voltage (Vss). A particular word line is selected by coupling one of the word line input driver nodes (16a–16d) to the group select node (24). The selected word line is driven to a pump voltage (Vpp) that is greater than the positive supply voltage (Vcc) by a word line driver circuit. Word lines are de-selected on the terminal edge of the i/RAS signal by simultaneously activating de-select transistors (18a–18d) coupled between each input driver node (16a–16d) and Vpp. In the preferred embodiment, the de-select operation also pre-charges the group select node (24) to Vcc–Vtn.

16 Claims, 3 Drawing Sheets

1

RANDOM ACCESS MEMORY WORD LINE SELECT CIRCUIT HAVING RAPID DYNAMIC DESELECT

TECHNICAL FIELD

The present invention relates generally to semiconductor memory devices and more particularly to word line driving circuits for random access memories.

BACKGROUND OF THE INVENTION

Random access memories (RAMs) typically include an array of memory cells for storing data. Each memory cell usually includes a storage element and an access element. For example, in dynamic RAMs (DRAMs), the storage element is a capacitor and the access element is a transistor. In a four-transistor static RAM (SRAM) cell, the storage element includes two impedance elements and two cross coupled transistors, and the access element includes two more transistors, each connecting a cross coupled node to a bit line. Cell data is accessed by turning on the access element in order to read data from, or write data to the cell. The typical RAM access operation has the access elements in a selected row of the array being commonly activated by a word line. When the word line is driven, the storage elements of the row are coupled to bit lines in the array. Thus, the amount of time required to drive the word line is an important factor in data access speed.

In order to maximize the RAM density while maintaining a cost effective die size, RAM memory cells are fabricated as small as possible. As a result, the signals produced by the memory cells is correspondingly small. If the impedance introduced by the access devices is too high, the resulting data signal placed on the bit lines can be attenuated to the point where the signal cannot be reliably detected.

It is known in the prior art to decrease RAM access times by driving the word lines with a "pump" voltage (referred to herein as "Vpp") that is higher than the positive power supply voltage of the RAM device. In metal-insulator-semiconductor (MOS) RAMs, such an approach also increases the conductance of the access elements, maximizing the magnitude of the data signal placed on the bit lines. A drawback to the prior art has been the size and complexity of the row driving circuits.

U.S. Pat. No. 4,649,521, issued to Tsuchida et al. on Mar. 10, 1987 and entitled PROGRAMMABLE READ-ONLY MEMORY (PROM) DEVICE HAVING REDUCED PROGRAMMING VOLTAGE CAPABILITY, discloses an EPROM row driving circuit that includes a CMOS inverter with a PMOS feedback device. The row driving circuit drives a word line to a program voltage (Vpp) in a program mode and to a positive supply voltage in a read mode.

U.S. Pat. No. 4,951,259, issued to Sato et al. on Aug. 21, 1990 and entitled SEMICONDUCTOR MEMORY DEVICE WITH FIRST AND SECOND WORD LINE DRIVERS, discloses a static RAM (SRAM) having a switching circuit situated between row decoder circuits and word line driver circuits. The switching circuit is activated by a predecoder circuit, and, in a first embodiment, isolates de-selected word line driver circuits from the row decoder circuits. In addition, reset MOSFETs, coupled between the inputs of each word line driver circuit and the positive power supply, are turned on in response to an externally applied control signal to prevent the word line driver inputs from floating.

Commonly owned, co-pending U.S. patent application Ser. No. 533,755, entitled REDUCED AREA WORD LINE DRIVING CIRCUIT FOR RANDOM ACCESS MEMORY, discloses a compact word line driving circuit having a CMOS inverter that drives a word line between ground and a boost voltage (Vpp). The circuit also includes a PMOS level shifting transistor. A drawback of this approach is the particular transistor sizing required. The PMOS level shifting transistor must be small enough to be over-powered by a decoder circuit and large enough to quickly pull the input node of the CMOS inverter to a boost (Vpp) voltage. In addition, the NMOS device in the CMOS inverter must be sized to pull-down the word line to ground when a voltage less than the power supply is applied to the inverter control gate.

It would be desirable to provide a word line select circuit that provides for rapid de-selection of word lines, without the sizing constraints and other drawbacks of the prior art.

SUMMARY OF THE INVENTION

It is an object of the present invention to provide a word line select circuit that drives a selected word line to a pump voltage and provides for rapid de-selection of word lines.

It is another object of the present invention to provide a CMOS word line select circuit that drives a word line to a pump voltage and does not have critical size requirements for NMOS word line pull-down devices.

It is yet another object of the present invention to provide a CMOS word line select circuit having a feedback level shifting PMOS device of minimal dimension.

According to the present invention, a word line select circuit includes a CMOS inverter coupled to a word line for driving the word line between a pump voltage and a low power supply voltage. The word line is selected by driving the input of the inverter low in response to an address signal and an initial edge of a clock signal. The word line is de-selected by driving the input of the CMOS inverter to the pump voltage in response to a subsequent edge of the clock signal.

Further according to the present invention, the word line select circuit includes a PMOS feedback level shifting transistor associated with each CMOS inverter.

Further according to the present invention, a group of word lines is selected by driving a group select node to a low power supply voltage. NMOS passgate transistors couple the group select node to the inputs of word line driving CMOS inverters. A particular word line within the selected word line group is driven by activating one of the NMOS passgate transistors while the group select node is at the low power supply.

Further according to the present invention, word lines are driven between a pump voltage and a low power supply by CMOS inverters. Coupled to the input of each CMOS inverter is a de-select transistor. Word lines are de-selected by simultaneously activating the de-select transistors, which pull the inverter input nodes to the pump voltage.

Further according to the present invention, inputs to word line driver inverters are coupled to a group select node by passgate transistors. De-select transistors couple the inputs of word line driver inverters to a high voltage, and when activated, pre-charge the group select node to a predetermined voltage.

An advantage of the present invention is that it provides a word line select circuit in which the word line de-select signals operate independently of row decode circuits, allowing for fast de-selection of word lines.

Another advantage of the present invention is that it provides a CMOS word line select circuit that does not require a PMOS device in the row decoding circuit.

3

Other objects and advantages of the present invention will become apparent in light of the following description thereof.

DETAILED DESCRIPTION OF THE EMBODIMENTS

Figure 1:
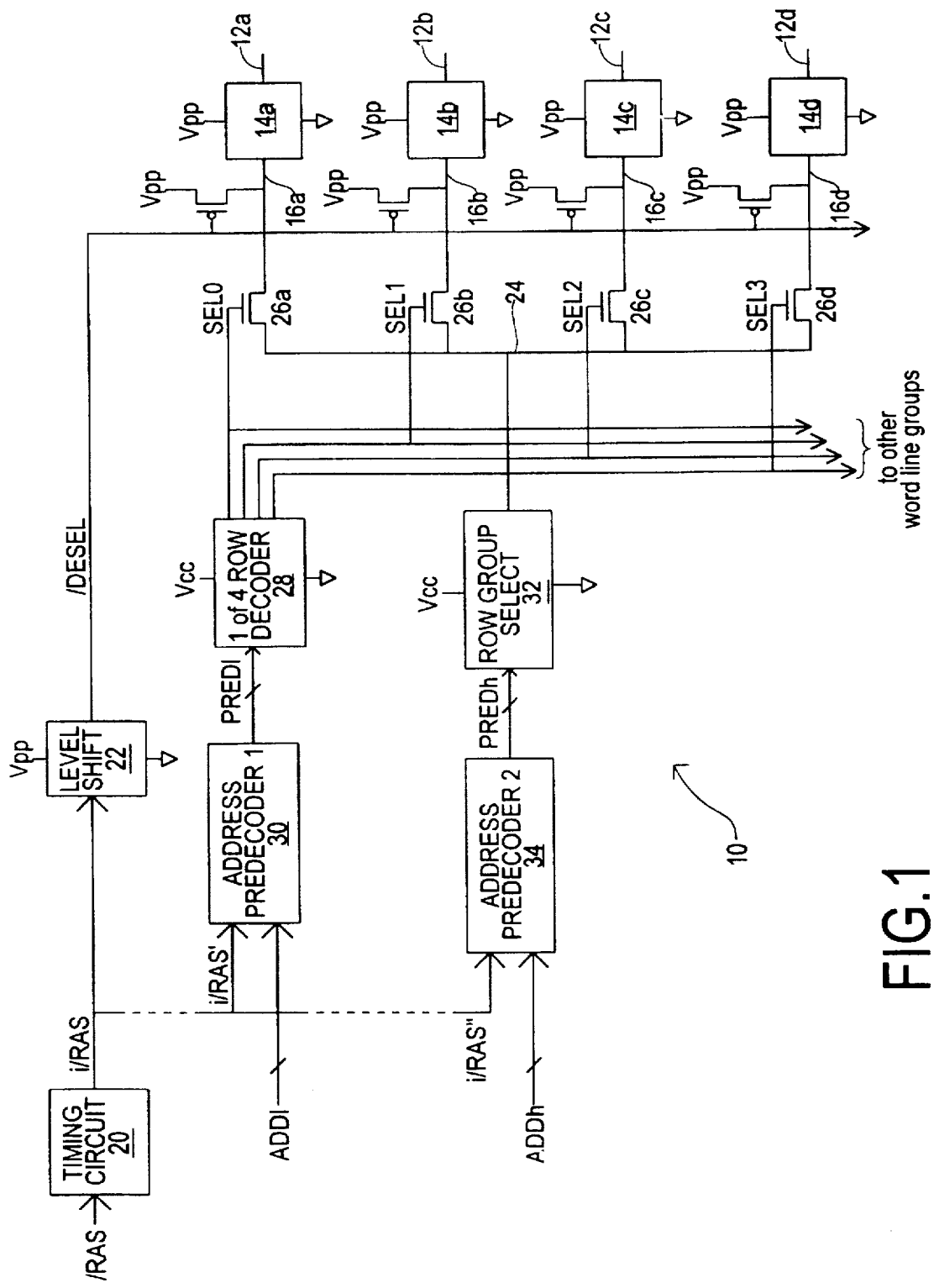
FIG. 1 is a block schematic diagram illustrating a word line select circuit according to a preferred embodiment of the present invention.

FIG. 1 sets forth, generally, a word line select circuit according to a preferred embodiment of the present invention. The word line select circuit is designated by the general reference character 10 and is intended for use in a dynamic random access memory (DRAM) having a high power supply voltage (Vcc), a low power supply voltage (Vss), and a charge pump circuit for generating a pump voltage (Vpp) that is greater than Vcc. The word line select circuit 10 selects one word line from a group of four word lines (12a–12d) by driving the selected word line to Vpp while the remaining word lines are held at Vss. As shown in FIG. 1, each word line (12a–12d) is driven by a corresponding driver circuit (14a–14d) coupled between Vpp and Vss. The driver circuits (14a–14d) are controlled by the voltage at respective driver input nodes (16a–16d), which voltage varies between Vpp and Vss.

A PMOS de-select transistor (18a–18d) is coupled to each driver input node (16a–16d). The de-select transistors (18a–18d) have source-drain paths connected between their respective driver input node (16a–16d) and Vpp. The gates of the de-select transistors (18a–18d) are commonly coupled to receive a /DESEL signal that varies between Vss and Vpp. In the preferred embodiment the /DESEL signal is common to a number of word line groups, and so is shown in FIG. 1 to extend past the illustrated group of four word lines (12a–12d). The /DESEL signal is generated from an internal clock signal (i/RAS) signal. The i/RAS signal is generated by a timing circuit 20 that receives and externally applied row address strobe signal (/RAS). DRAM /RAS timing circuits are well understood in the art, and so will not be discussed in any further detail herein. The i/RAS signal follows the transitions of /RAS signal, and varies between Vcc and Vss. The /DESEL signal is generated by a level shift circuit 22 that receives the i/RAS signal. When i/RAS transitions from Vcc to Vss, the /DESEL signal transitions from Vss to Vpp, and vice versa.

The driver input nodes (16a–16d) are each coupled to a group select node 24 by corresponding NMOS select transistors (26a–26d). The gate of each select transistor (26a–26d) is driven by a different row select signal (shown as SEL0–SEL3). In the preferred embodiment, the row select signals vary between Vcc and Vss and are generated from a 1-of-4 row decoder circuit 28 in response to a first set of predecoder signals (PREDl). The activation of the select signals is exclusive in time; only one of the four SEL0–SEL3 is high in any given cycle. In addition, the select signals are provided to other groups of word lines of the DRAM. The PREDl signals are generated by a first address predecoder 30. According to well understood techniques, the address predecoder generates predecode signals in response to the combination of the i/RAS signal

4 and a first portion of a row address (ADD1). The i/RAS signal received by the first address predecoder 30 is shown as i/RAS', to indicate the introduction of some propagation delay to the i/RAS signal caused by the circuit path between timing circuit 20 and the first address predecoder 30.

The select node 24 is driven from a high voltage to Vss by a row group select circuit 32 in response to a second set of predecoder signals (PREDh). In a similar manner to the PREDl signals, the PREDh signals are generated by a second address predecoder 34 in response to a second portion of a row address (ADDh) and the i/RAS signal. As in the case of the first address predecoder 30, the i/RAS signal received by the second address predecoder 34 is designated as i/RAS" to indicate the introduction of some propagation delay.

Figure 2:
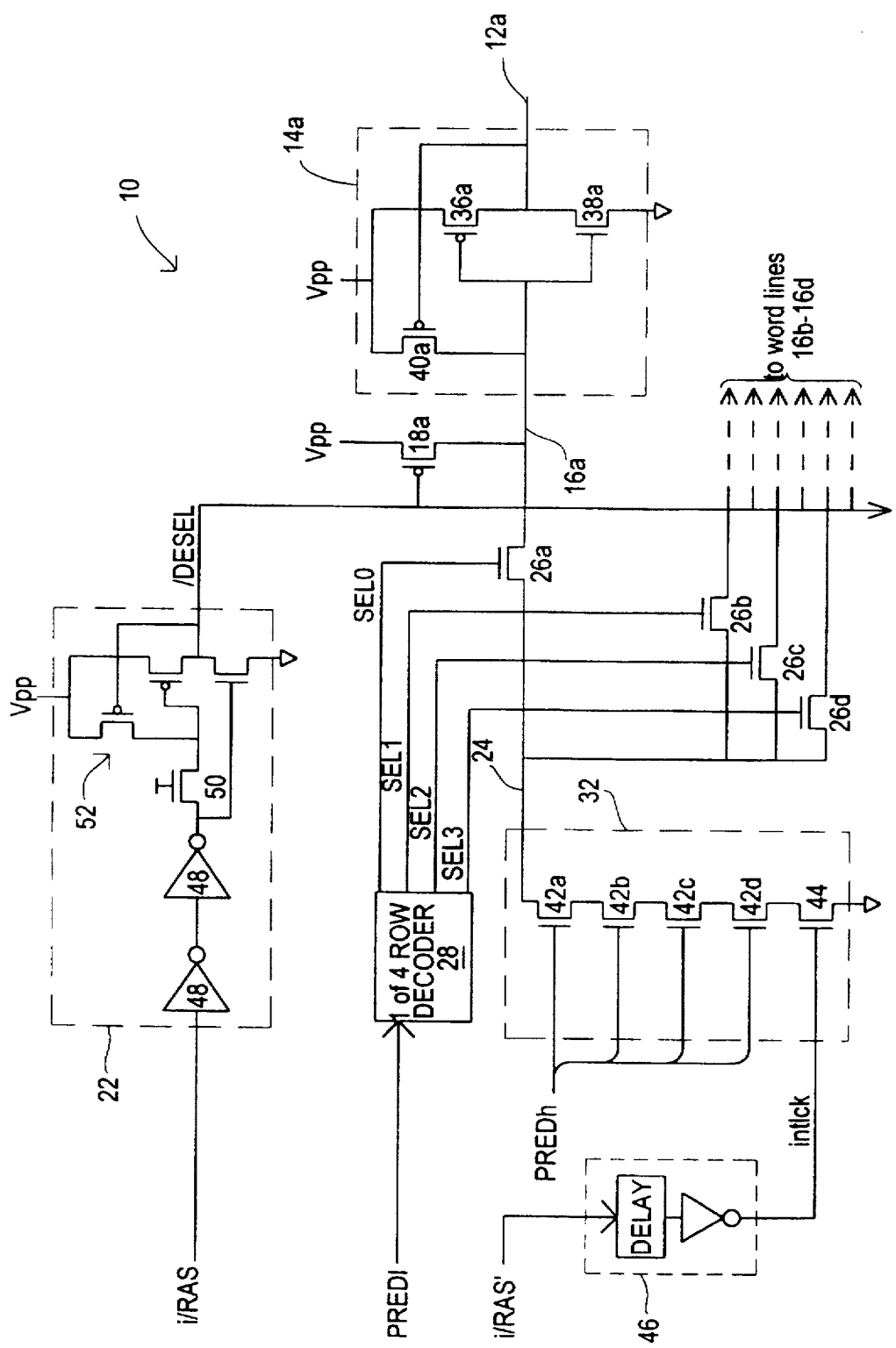
FIG. 2 is schematic diagram illustrating one embodiment of the present invention.

Referring now to FIG. 2, a detailed schematic diagram is set forth illustrating a preferred embodiment of the present invention. FIG. 2 sets forth only one word line driver circuit 14a and its corresponding de-select transistor 18a. The driver circuit 14a is shown to include a PMOS pull-up transistor 36a and an NMOS pull-down transistor 38a arranged in CMOS inverter configuration. The source of the pull-up transistor 36a is coupled to Vpp and the source of the pull-down transistor 38a is coupled to Vss. The drains of the two transistors (36a and 36b) are commonly coupled to word line 12a. The driver circuit 14a further includes a PMOS feedback transistor 40a having its source coupled to Vpp, its drain coupled to input driver node 16a, and its gate coupled to word line 12a. It is noted that in prior art approaches, the feedback transistor 40 was the only device available for level shifting the driver input node 16a (pulling the node to Vpp). As a result, the feedback transistor was subject to sizing constraints. If the feedback transistor was too large, the word line select operation could take a relatively long time, as the row group select circuit 32 would have to fight the feedback transistor when pulling the group select node 24 low. Conversely, if the feedback transistor was too small, the speed of de-select operations could suffer, as the feedback transistor could take a relatively long time to pull the driver input node to Vpp. In the preferred embodiment, the de-select operation is dominated by the de-select transistors (18a–18d). Accordingly, the feedback transistor 40a can be smaller than prior art approaches, serving primarily as a clamping device for maintaining the input driver node 16a at Vpp in the de-select state. This arrangement also provides for more flexibility in the design of the row group select circuit 32, which does not have to fight a feedback transistor in order to select a word line. In addition, the transistors (36a and 38a) of the word line driver 14a can be sized smaller, as a particularly large NMOS pull-down transistor is not needed. In an alternate embodiment, feedback transistors in the word line driver circuits (14a–14d) can be discarded altogether, with the word line driving circuits having only a two-transistor CMOS inverter configuration. Or, if desired, the de-select transistor 18a could be driven by a /DESEL signal that varies between Vcc and Vss. In such an arrangement, the de-select transistor 18a would pull the input driver node 16a to a first high level, with the feedback transistors 40a completing the de-select operation by pulling the input driver node 16a to a full Vpp level.

Figure 3:
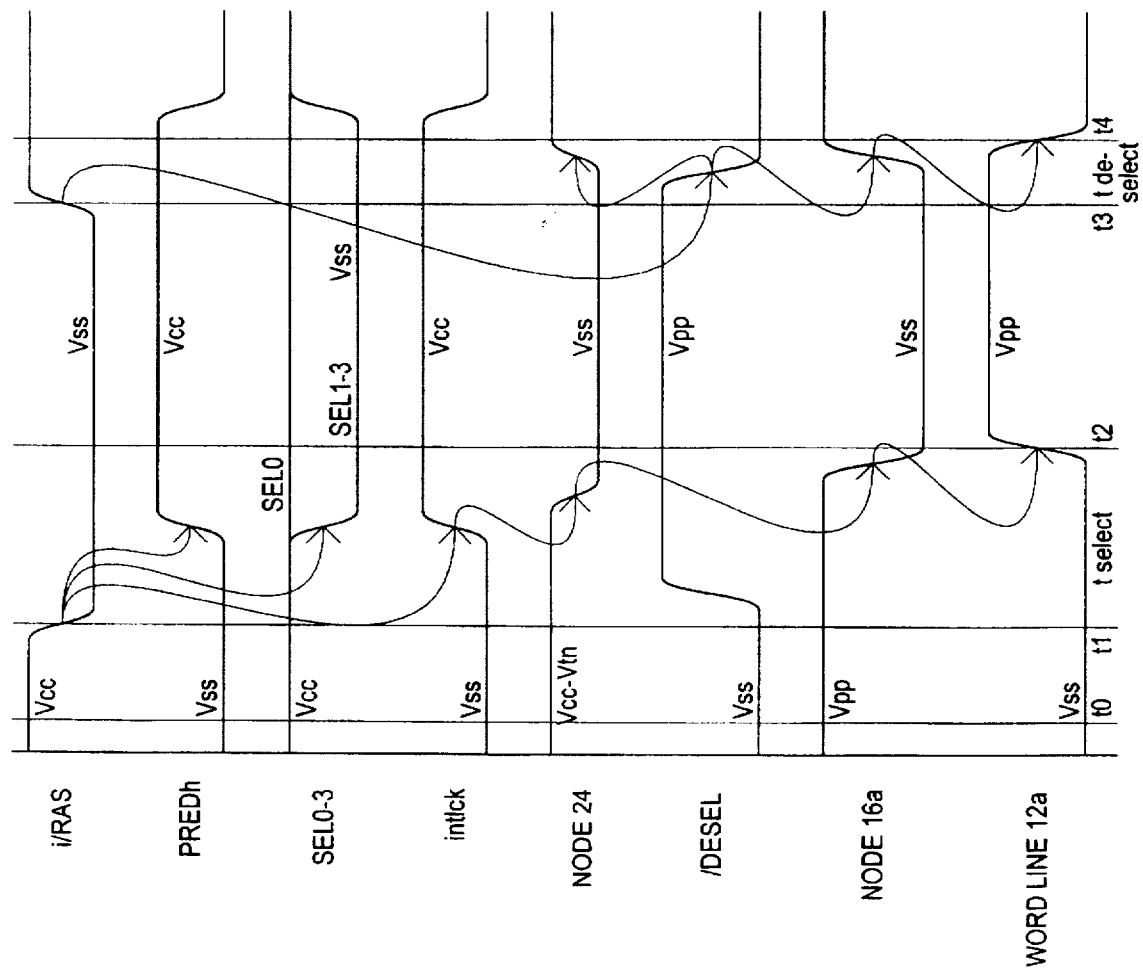
FIG. 3 is a timing diagram illustrating the operation of the embodiment set forth in FIG. 2.

The row group select circuit 32 of the embodiment of FIG. 3 includes four NMOS decode transistors (42a–42d) and one interlock transistor 44. The four decode transistors (42a–42d) and interlock transistor 44 are connected in series between the group select node 24 and the Vss. Each of the decode transistors (42a–42d) receives a predecode signal at its gate. The interlock transistor 38 receives an interlock signal (shown as "intlck") at its gate. The interlock signal is generated by applying the i/RAS' signal to a inverting delay circuit 46. As will be recalled, the i/RAS' signal controls the activation of the SEL0–SEL3 signals. Because of the this, the operation of the row group select circuit 32 is interlocked with the activation of the select transistors (26a–26d), ensuring that the group select node 24 is not pulled to Vss before three of the four select transistors (corresponding to the de-selected rows) are turned off. It is also noted that the intlck signal could also include decoding information as well.

A level shift circuit 22 according to a preferred embodiment is also set forth in detail in FIG. 3. The i/RAS signal is received by two, series connected level shift input inverters (48a–48b). The output of the inverters (48a–48b) is coupled directly to the gate of the NMOS pull-down transistor of a Vpp driver 52, and to the gate of the PMOS pull-up transistor of Vpp driver 52 by way of isolation transistor 50. The Vpp driver 52 is a CMOS inverter coupled between Vpp and Vss having a PMOS Vpp driver feedback transistor. The level shift circuit 22 ensures that the PMOS de-select transistors receive a /DESEL signal that has a magnitude ranging from full Vpp to Vss. As mentioned previously, the /DESEL signal could vary between Vcc and Vss in which case the level shift circuit 22 would not be needed.

The operation of the word line driver circuit 10 is best understood with reference to FIG. 2 in conjunction with FIG. 3. FIG. 3 sets forth a timing diagram illustrating the operation of the embodiment set forth in FIG. 2. At time t0, the DRAM is ready to begin an active cycle, and all the word lines (12a–12b) are deselected. In this state, i/RAS is high, and correspondingly, the PREDh signals are low, the SEL0–3 signals are high, the interlock signal is low, and /DESEL is low. With /DESEL low, all of the de-select transistors (18a–18d) are turned on and driver inputs nodes (16a–16d) are pulled to Vpp. In response to the Vpp levels at the driver input nodes (16a–16d), the pull-down transistors (38a–38d) of the driver circuits (14a–14d) are on, and the word lines (12a–12d) are pulled to Vss. With the word lines (12a–12d) at Vss, the feedback transistors (40a–40d) are on, and help maintain the driver input nodes (16a–16d) at Vpp. In addition, because the SEL0–3 signals are high, the select transistors (26a–26d) are turned on. With the select transistors (26a–26d) on, and the input driver nodes (16a–16d) nodes at Vpp, the group select node 24 is precharged to Vcc–Vtn (Vtn being the threshold voltage of the select transistors (26a–26d)).

At time t1, i/RAS falls from Vcc to Vss initiating an active cycle in the DRAM. Such low-going transitions are well understood in the art, and can follow from an externally applied /RAS signal from a DRAM controller, or can be generated on the DRAM itself, as in the case of self-refresh and related functions. Row decoding takes place in a conventional fashion, with the first and second address predecoders (30 and 34) (shown in FIG. 1) decoding the row address, and in combination with the i/RAS signal, activating certain PRED1 and PREDh signals. For the purposes of this description, it is assumed that the row address applied activates those PREDh signals that trigger the row group select circuit 32, resulting in the selection of the four word lines (12a–12d) set forth in the various figures. Further, it is assumed that the combination of PRED1 signals applied to the 1 of 4 row decoder 26 activates the SEL0 signal, selecting word line 12a from the group of four selected word lines (12a–12d).

Referring once again to FIG. 3, in response to the i/RAS transition from Vcc to Vss, the level shift input inverters 48 of the level shift circuit 22 drive the input to isolation transistor 50 to Vss. The low Vss level is coupled via the source drain path of the isolation transistor 50 to the gate of the PMOS device in the Vpp driver 52. The Vpp driver 52 drives /DESEL from Vss to Vpp. When /DESEL is driven to Vpp, the de-select transistors (18a–18d) are fully turned off.

The low-going i/RAS signal also activates the PRED1 and PREDh signals. After some propagation delay, according to the particular row address of the example illustrated, all of the PREDh signals are driven high, turning on decode transistors (42a–42d). At the same time, the PRED1 signals applied to the 1-of-4 row decoder 28 result in the SEL0 signal maintaining a high (Vcc) level, while the remaining select signals SEL1–3 go low (Vss). It is noted that when the decode transistors (42a–42d) are turned on, the group select node 24 will be pulled to Vss, provided that the interlock transistor 44 is turned on. As will be recalled, the interlock transistor 44 can only be turned on after SEL1–3 have gone low.

With the group select node 24 low and SEL0 high, node 16a discharges through select transistor 26a and falls to Vss. In response to input driver node 16a falling to Vss, the pull-down transistor 38a of the word line driver circuit 14a is turned off, and the corresponding pull-up transistor 36a is turned on. In this manner, the word line 12a is selected and driven to Vpp at time t2. The rising word line 12a voltage also turns off the feedback transistor 40a.

As set forth in FIG. 3, the time between the high-to-low transition of the i/RAS signal (t1) and the low-to-high transition of word line 12a (t2) is labeled as a select time (t select).

The data access or refresh operation is complete at time t3, and the i/RAS signal returns to the high state. The level shift input inverters 48 drive the gate of the NMOS pull-down device in Vpp driver 52 to Vcc. The /DESEL signal is driven low and the de-select transistors (18a–18d) are turned on. With de-select transistor 18a on, driver input node 16a is driven to Vpp (the remaining driver input nodes (16b–16d) were already at Vpp). In response to driver input node 16a rising to Vpp, the word line driver circuit 14a de-selects word line 12a at time t4, pulling it back to Vss. The low-going word line 12a voltage enables the feedback transistor 40a, which, in turn, assists in pulling node 16a to Vpp.

The time between the low-to-high transition of the i/RAS signal (t3) and the high-to-low transition of word line 12a (t4) is labeled as a de-select time (t de-select).

It is noted that in the de-select operation, the word lines are driven low in response to the /DESEL signal, and unlike the select operation, are not dependent upon the row decoding circuits (i.e., a change of state in group select node 24 and one of the select signals SEL0–SEL3). In addition, there is less propagation delay between the fall of i/RAS and /DESEL than between i/RAS and SEL0. Accordingly, t de-select is less than t select.

As also shown in FIG. 3, the word line 12a is de-selected before SEL0 returns to Vcc or the PREDh signals fall to Vss. Due to this timing arrangement, the de-select transistors (18a–18d) perform the additional function of pre-charging the group select node 24, in addition to the function of rapid de-select, previously described. When the group of word lines is de-selected, the de-select transistors (18a–18d) overpower the four series connected decode transistors (42a–42d) and interlock transistor 44, and the group select node 24 is precharged to Vcc–Vtn through the select transistors (26a–26d).

While the preferred embodiment describes sets forth one particular de-select timing arrangement, the de-select timing of the present invention could be subject to some variation. The preferred embodiment has the de-select transistors dominating the decode transistors in the de-select operation. However, smaller de-select transistors could be employed. In such an arrangement, the decode transistors would overpower the de-select transistor, and the group select node 24 would be pulled high only after one of the PREDh signals or the intlck signal returned to the low (de-select) state, isolating the group select node 24 from Vss. Along these same lines, the row group select circuit 32 could also include a PMOS pull-up device, having a drain coupled to the group select node 24, a source coupled to Vcc, and a gate receiving a signal that is generally synchronous with the i/RAS signal and of opposite polarity. Such a PMOS device would assist in the de-select operation by turning on, and pulling the group select node 24 to Vcc.

It is understood that the embodiments set forth herein are only some of the possible embodiments of the present invention, and that the invention may be changed and other embodiments derived without departing from the spirit and scope of the invention. Accordingly, the present invention is intended to be limited only by the appended claims.

What we claim is:

1. In a random access memory having at least one array of memory cells, a word line driver circuit, comprising:

a plurality of word lines;

a driver stage coupled to each word line, each driver stage including a first transistor of a first conductivity type having a source-drain path coupled between a word line and a first voltage and a second transistor of a second conductivity type having a source-drain path coupled between the word line and a reference voltage, the control gates of the first and second transistors being commonly coupled to a drive node;

a select circuit including
      a passgate transistor associated with each drive stage, each passgate transistor having a source-drain path coupled between the drive node of its associated driver stage and a decode node, and
      a pre-charge circuit coupled between the decode node and a second voltage, the second voltage being less than the first voltage, said select circuit being responsive to at least one decode signal; and a dynamic de-select circuit including a pull-up circuit coupled between the drive node and the first voltage and responsive to a first control signal.

2. The word line driver circuit of claim 1, wherein:

each said driver stage includes a third transistor of the first conductivity type having a source-drain path coupled between the drive node and the first voltage, and having a control gate coupled to the word line.

3. The word line driver circuit of claim 1, wherein:

each the passgate transistor has a control gate coupled to at least one decode signal.

4. The word line driver circuit of claim 1, wherein:

said select circuit includes a plurality of decode transistors of the second conductivity type having source-drain paths coupled in series between the decode node and the reference voltage.

5. The word line driver circuit of claim 4, wherein:

the operation of at least one of the decode transistors is interlocked with the operation of the passgate transistor.

6. The word line driver circuit of claim 1, wherein:

said dynamic de-select circuit includes a de-select transistor of the first conductivity type having a source-drain path coupled between the first voltage and the drive node.

7. The word line driver circuit of claim 1, wherein:

said dynamic de-select circuit includes a level shifting circuit for receiving a timing signal that varies between the reference voltage and a supply voltage, and generates therefrom, a de-select signal that varies between the reference voltage and the first voltage.

8. In a random access memory, a circuit for driving word lines, comprising:

a plurality of word lines;

a first means coupled to each word line, for driving its respective word line to a first voltage in response to a logic low voltage at a drive node, and for driving the word line to a low voltage in response to the first voltage at the drive node;

second means for coupling the drive node to the first voltage in response to a de-select signal that varies between the logic low voltage and a logic high voltage;

third means for coupling the logic low voltage to a decode node in response to at least one decode signal that varies between the logic low voltage and the logic high voltage; and fourth means for coupling the decode node to the drive nodes of one of the first means, the fourth means including an n-channel isolation transistor coupled to each first means, each isolation transistor coupling the drive node of its respective first means to the decode node; wherein the first voltage is greater in magnitude than the logic high voltage.

9. The circuit of claim 8, wherein:

the first voltage is a positive voltage.

10. The circuit of claim 8, wherein:

said first means includes at least one p-channel transistor coupled between the word line and a first voltage node, and at least one n-channel transistor coupled between the word line and the logic low voltage.

11. The circuit of claim 8, wherein:

said first means includes a feedback p-channel transistor having a gate coupled to the word line, a source coupled to a first voltage node, and a drain coupled to the drive node.

12. The circuit of claim 8, wherein:

said second means includes a de-select p-channel transistor having a source coupled to a first voltage node and a drain coupled to the drive node.

13. The circuit of claim 12, wherein:

said third means includes an n-channel isolation transistor having a source-drain path for receiving a select signal.

14. In a random access memory having a high supply voltage, a low supply voltage, and a pumping circuit for generating a pump voltage that is greater than the high supply voltage, a word line select circuit, comprising:

a plurality of word lines;

a word line driver circuit coupled to each word line, each said word line driver circuit driving its respective word line between the pump voltage and the low supply voltage in response to drive voltages received on an input node;

a de-select circuit coupled to the input nodes of a plurality of word line driver circuits, said de-select circuit driving the input nodes to the pump voltage during a de-select cycle; and a select circuit coupled to the input nodes of a plurality of word line driver circuits, said select circuit driving the input node of a selected word line driver circuit to the low supply voltage in response to a predetermined combination of select signals during a select cycle, said select circuit including
- a passgate transistor coupling each input node of a selected number of said word line driver circuits to a common decode node, each passgate transistor being responsive to a different first select signal, and
- a pull-down circuit for coupling the decode node to the low supply voltage in response to at least one second select signal.

15. The word line select circuit of 14, wherein:

the random access memory is a synchronous dynamic random access memory; and said de-select circuit is responsive to a periodic de-select signal.

16. The word line select circuit 14, wherein:

said de-select circuit includes
- a pull-up circuit responsive to a de-select drive signal and coupled between a plurality of word line driver input nodes and the pump voltage,
- an input circuit for receiving a de-select logic signal that varies between the low supply voltage and the high supply voltage, and
- a level shifting circuit for receiving the de-select logic signal and generating a de-select drive signal in response thereto, the de-select drive signal varying between the low logic level and the pump voltage.

* * * * *

(12) EX PARTE REEXAMINATION CERTIFICATE (9514th)
United States Patent
Patel et al.

(10) Number: US 5,781,497 C1
(45) Certificate Issued: Feb. 20, 2013

(54) RANDOM ACCESS MEMORY WORD LINE SELECT CIRCUIT HAVING RAPID DYNAMIC DESELECT

(75) Inventors: Vipul Patel, San Jose, CA (US); Chitranjan N. Reddy, Los Altos Hills, CA (US)

(73) Assignee: Advanced Data Access LLC, Frisco, TX (US)

Reexamination Request:
No. 90/012,078, Jan. 5, 2012
No. 90/012,143, Feb. 14, 2012

Reexamination Certificate for:
Patent No.: 5,781,497
Issued: Jul. 14, 1998
Appl. No.: 08/695,064
Filed: Aug. 2, 1996

(51) Int. Cl.
*G11C 8/08* (2006.01)
*G11C 8/00* (2006.01)
*G11C 8/10* (2006.01)

(52) U.S. Cl. ............... 365/230.06; 365/189.11; 365/203
(58) Field of Classification Search .................... None
See application file for complete search history.

(56) References Cited

To view the complete listing of prior art documents cited during the proceedings for Reexamination Control Numbers 90/012,078 and 90/012,143, please refer to the USPTO's public Patent Application Information Retrieval (PAIR) system under the Display References tab.

*Primary Examiner* — Ovidio Escalante

(57) ABSTRACT

A word line select circuit (10) having a rapid de-select operation is disclosed. A group of word lines (12a-12d) is selected in response to a row address and the initial edge of a timing signal (i/RAS) by pulling a group select node (24) to a low power supply voltage (Vss). A particular word line is selected by coupling one of the word line input driver nodes (16a-16d) to the group select node (24). The selected word line is driven to a pump voltage (Vpp) that is greater than the positive supply voltage (Vcc) by a word line driver circuit. Word lines are de-selected on the terminal edge of the i/RAS signal by simultaneously activating de-select transistors (18a-18d) coupled between each input driver node (16a-16d) and Vpp. In the preferred embodiment, the de-select operation also pre-charges the group select node (24) to Vcc-Vtn.

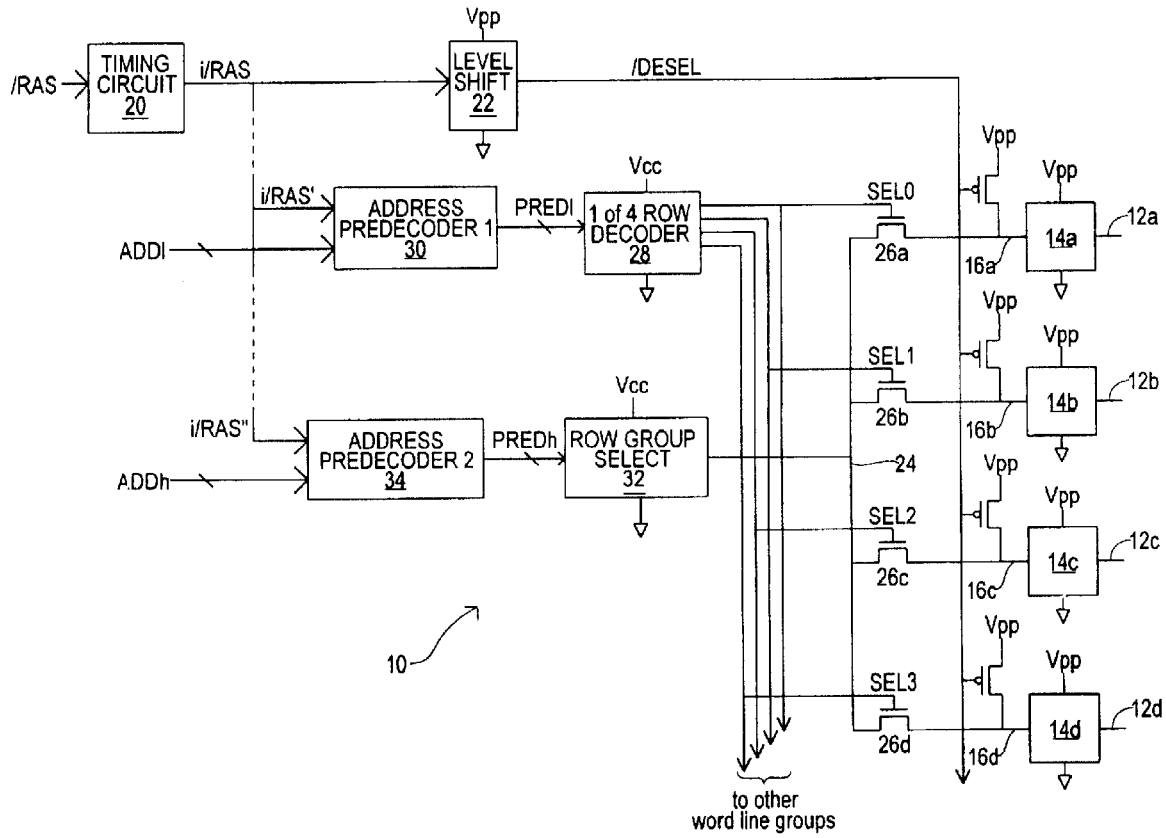

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-6 and 8-15 is confirmed.

Claims 7 and 16 were not reexamined.

* * * * *

US005781497C2

(12) EX PARTE REEXAMINATION CERTIFICATE (9558th)

United States Patent
Patel et al.

(10) Number: US 5,781,497 C2
(45) Certificate Issued: Mar. 12, 2013

(54) RANDOM ACCESS MEMORY WORD LINE SELECT CIRCUIT HAVING RAPID DYNAMIC DESELECT

(75) Inventors: Vipul Patel, San Jose, CA (US); Chitranjan N. Reddy, Los Altos Hills, CA (US)

(73) Assignee: Advanced Data Access LLC, Frisco, TX (US)

Reexamination Request:
No. 90/012,703, Oct. 12, 2012

Reexamination Certificate for:
Patent No.: 5,781,497
Issued: Jul. 14, 1998
Appl. No.: 08/695,064
Filed: Aug. 2, 1996

Reexamination Certificate C1 5,781,497 issued Feb. 20, 2013

(51) Int. Cl.
*G11C 8/08* (2006.01)
*G11C 8/10* (2006.01)

(52) U.S. Cl. .............. 365/230.06; 365/189.11; 365/203

(58) Field of Classification Search .................. None
See application file for complete search history.

(56) References Cited

To view the complete listing of prior art documents cited during the proceeding for Reexamination Control Number 90/012,703, please refer to the USPTO's public Patent Application Information Retrieval (PAIR) system under the Display References tab.

*Primary Examiner* — Ovidio Escalante

(57) ABSTRACT

A word line select circuit (10) having a rapid de-select operation is disclosed. A group of word lines (12a-12d) is selected in response to a row address and the initial edge of a timing signal (i/RAS) by pulling a group select node (24) to a low power supply voltage (Vss). A particular word line is selected by coupling one of the word line input driver nodes (16a-16d) to the group select node (24). The selected word line is driven to a pump voltage (Vpp) that is greater than the positive supply voltage (Vcc) by a word line driver circuit. Word lines are de-selected on the terminal edge of the i/RAS signal by simultaneously activating de-select transistors (18a-18d) coupled between each input driver node (16a-16d) and Vpp. In the preferred embodiment, the de-select operation also pre-charges the group select node (24) to Vcc-Vtn.

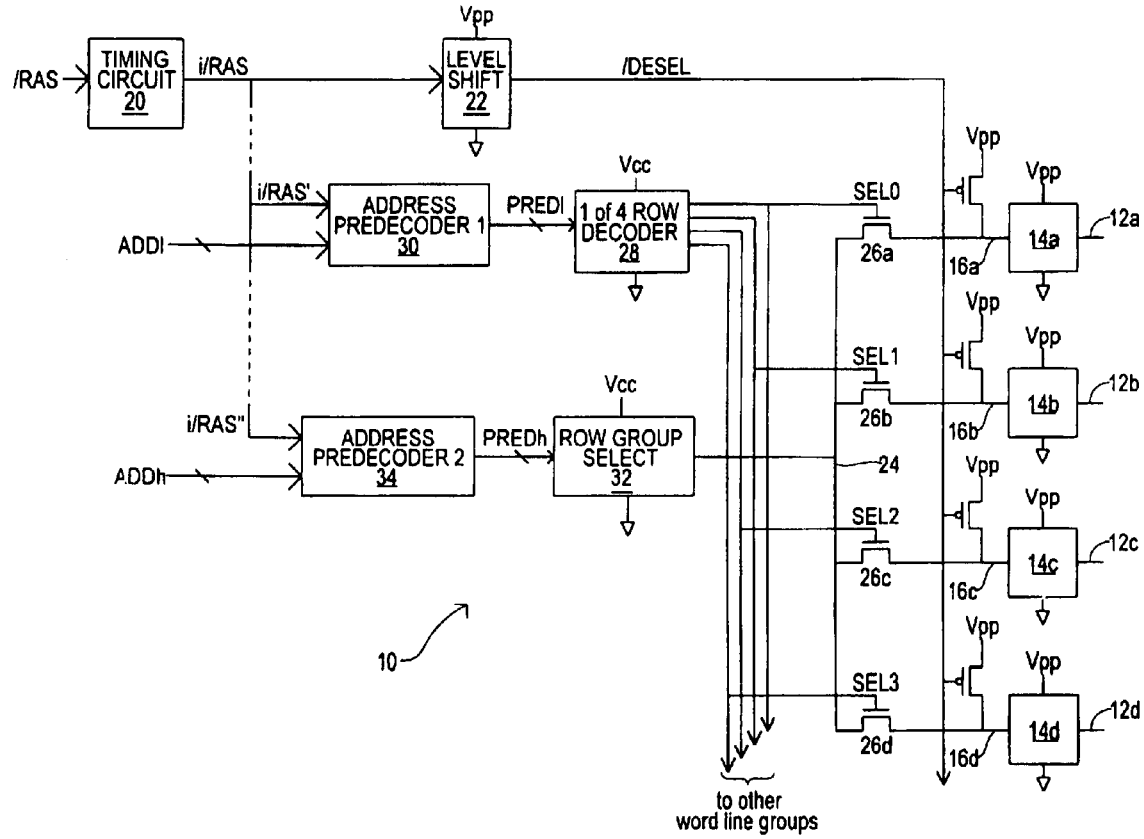

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 8-13 is confirmed.

Claims 1-7 and 14-16 were not reexamined.

* * * * *